US009502279B2

(12) United States Patent
Newton (10) Patent No.: US 9,502,279 B2
(45) Date of Patent: *Nov. 22, 2016

(54) INSTALLATION FIXTURE HAVING A MICRO-GROOVED NON-STICK SURFACE

(71) Applicant: Lam Research Corporation, Fremont, CA (US)

(72) Inventor: Neal Newton, San Jose, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 473 days.

This patent is subject to a terminal disclaimer.

(21) Appl. No.: 13/930,659

(22) Filed: Jun. 28, 2013

(65) Prior Publication Data

US 2015/0003903 A1    Jan. 1, 2015

(51) Int. Cl.
*H01L 21/67*    (2006.01)
*H01L 21/687*    (2006.01)

(52) U.S. Cl.
CPC ... *H01L 21/68785* (2013.01); *H01L 21/67126* (2013.01); *Y10T 29/4987* (2015.01); *Y10T 403/67* (2015.01)

(58) Field of Classification Search
CPC ........ B23P 19/08; B23P 19/084; F16B 2/04; F16B 2/065; H01L 21/67; H01L 21/287; H01L 21/70
USPC .......... 269/189, 230, 287, 243; 29/222, 223, 29/235, 243.517, 243.518, 269; 156/345; 118/728–732, 500; 403/342
See application file for complete search history.

(56) References Cited

U.S. PATENT DOCUMENTS

| | | |
|---|---|---|
| 5,636,098 A | 6/1997 | Salfelder et al. |
| 5,740,009 A | 4/1998 | Pu et al. |
| 6,090,304 A | 7/2000 | Zhu et al. |
| 6,364,957 B1 | 4/2002 | Schneider et al. |
| 6,771,482 B2 | 8/2004 | Kenney |
| 6,944,006 B2 | 9/2005 | Zheng et al. |
| 7,252,738 B2 | 8/2007 | Tong et al. |
| 7,274,004 B2 | 9/2007 | Benjamin et al. |
| 7,431,788 B2 | 10/2008 | Ricci et al. |
| 7,514,506 B2 | 4/2009 | Mansfield et al. |
| 7,723,994 B2 | 5/2010 | Kimball et al. |
| 7,884,925 B2 | 2/2011 | Howard et al. |
| 7,942,425 B2 | 5/2011 | Shojima |
| 8,038,796 B2 | 10/2011 | Ricci et al. |
| 8,409,995 B2 | 4/2013 | Kobayashi |
| 8,844,106 B2 * | 9/2014 | Chhatre ............. H01L 21/6719 29/235 |
| 2009/0179366 A1 | 7/2009 | Herchen et al. |
| 2009/0200239 A1 | 8/2009 | Axen et al. |
| 2010/0044974 A1 | 2/2010 | Kenworthy et al. |

(Continued)

*Primary Examiner* — Joseph J Hail
*Assistant Examiner* — Jamal Daniel
(74) *Attorney, Agent, or Firm* — Buchanan Ingersoll & Rooney PC (57) ABSTRACT

An apparatus and method adapted to mount an elastomer band in a mounting groove around a semiconductor substrate support used for supporting a semiconductor substrate in a plasma processing chamber, which includes an installation unit having a top ring, a clamp ring, and a base ring, and upon tightening of the top ring onto the base ring, the elastomer band is clamped between the clamp ring and the base ring, and a clamping surface adapted to release the elastomer band on at least one of a lower surface of the clamp ring and/or an upper surface of the base ring. A latch and release mechanism, which releases the elastomer band into the mounting groove by declamping the elastomer band from between the clamp ring and the base ring.

16 Claims, 7 Drawing Sheets

(56) References Cited

U.S. PATENT DOCUMENTS

| | | |
|---|---|---|
| 2010/0078899 A1 | 4/2010 | Povolny et al. |
| 2010/0108261 A1 | 5/2010 | Augustino et al. |
| 2010/0117309 A1 | 5/2010 | Yudovsky |
| 2015/0170942 A1* | 6/2015 | Chhatre ............... H01L 21/70 29/450 |

* cited by examiner

INSTALLATION FIXTURE HAVING A MICRO-GROOVED NON-STICK SURFACE

FIELD OF THE INVENTION

The present disclosure relates to an installation fixture having one or more micro-grooved non-stick surfaces for installing an elastomer band around a substrate support and methods of using the installation fixture.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modem digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, $He$ or $Ar$ is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls.

Plasmas used for reactive ion etching are highly corrosive species and chamber component surfaces that are exposed to plasmas can degrade quickly. Such degradation of chamber components is costly and can lead to contamination of chamber components or to contamination of a substrate being processed in the chamber. Such degradation requires replacement of contaminated chamber components and/or cleaning of the contaminated chamber components. Such replacement and/or cleaning of the chamber components leads to down-time of the processing chamber.

A substrate support comprising an electrostatic chuck (ESC) for electrostatically clamping a substrate to the support is one such chamber component that may undergo degradation due to exposure to a plasma environment. These types of substrate supports typically comprise a number of components adhered to one another. For example, the support may comprise a cooling plate, a heater element and/or a ceramic plate bonded to one another by a suitable adhesive. To minimize degradation from exposure to the plasma environment, it is common to place an elastomer band around these components in order to protect the adhesive from direct exposure to the plasma environment, such as described in commonly-owned U.S. Pat. No. 7,431,788. However, the elastomer band is then directly exposed to the plasma environment and suffers degradation therefrom. The elastomer band also suffers degradation from compression forces under operational conditions.

The manner in which an elastomer band is installed around a substrate support may also yield localized stresses in the elastomer band, which leads to the elastomer band being further susceptible to degradation from exposure to the plasma environment. Typically, an elastomer band is installed around a substrate support by hand in a 5-point star-shaped pattern. Such an installation pattern creates highly localized stress areas in the elastomer, which are weaker areas in the elastomer and subjects these areas to greater mass loss when exposed to a plasma environment, usually leading to cracking of the elastomer.

Thus, there is a need for an improved apparatus and method of installing an elastomer band around a substrate support such that the elastomer band demonstrates increased resistance to degradation from exposure to a plasma environment.

SUMMARY

Disclosed herein is an elastomer band installation fixture that installs an elastomer band around a substrate support with increased resistance to degradation from exposure to a plasma environment and compression forces. An elastomer band installed around a substrate support with the installation fixture disclosed herein can have a longer operational lifetime, thereby decreasing the frequency in which the elastomer band needs to be replaced.

In accordance with an exemplary embodiment, an annular installation fixture adapted to mount an elastomer band in a mounting groove around a semiconductor substrate support used for supporting a semiconductor substrate in a plasma processing chamber is disclosed, comprising: an installation unit comprising: a top ring, the top ring having one or more internal threads; a clamp ring; a base ring, the base ring having one or more external threads, which are configured to receive the one or more internal threads of the top ring, and upon tightening of the top ring onto the base ring, the elastomer band is clamped between a lower surface of the clamp ring and an upper surface of the base ring, and a clamping surface adapted to release the elastomer band on at least one least one of the lower surface of the clamp ring and/or the upper surface of the base ring; and a latch and release mechanism, which releases the elastomer band into the mounting groove by declamping the elastomer band from between the clamp ring and the base ring; and a band loader, which positions the elastomer band within the installation unit between the clamp ring and the base ring.

In accordance with an exemplary embodiment, a method of installing an elastomer band as a protective edge seal around a portion of a semiconductor substrate support used for supporting a semiconductor substrate in a plasma processing chamber is disclosed, comprising: expanding an elastomer band into a circular shape having a diameter greater than a diameter of a mounting groove around the substrate support; clamping the elastomer band in the expanded shape between a base ring and a clamp ring, wherein at least one of the base ring and the clamp ring has a clamping surface adapted to release the elastomer band comprised of a plurality of grooves on an upper surface of the base ring and/or a lower surface of the clamp ring; placing the elastomer band over the substrate support in the expanded shape; and releasing the elastomer band from between the base and the clamp rings, which contracts the elastomer band into the mounting groove of the substrate support.

It is to be understood that both the foregoing general description and the following detailed description are exemplary and explanatory and are intended to provide further explanation of the invention as claimed.

BRIEF DESCRIPTION OF THE DRAWINGS

Reference will now be made in detail to the present preferred embodiments of the invention, examples of which are illustrated in the accompanying drawings. Wherever possible, the same reference numbers are used in the drawings and the description to refer to the same or like parts.

DETAILED DESCRIPTION

Substrate supports for reactive ion etch processing chambers typically include a lower electrode assembly comprising an electrostatic clamping layer on which a substrate or wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a temperature controlled base plate (hereafter referred to as cooling plate) adhesively bonded to the heaters and heater plate. To protect the plasma-exposed adhesive bond layers, an edge seal comprising an elastomer band may be disposed around the bond layers of the substrate support.

Figure 1:
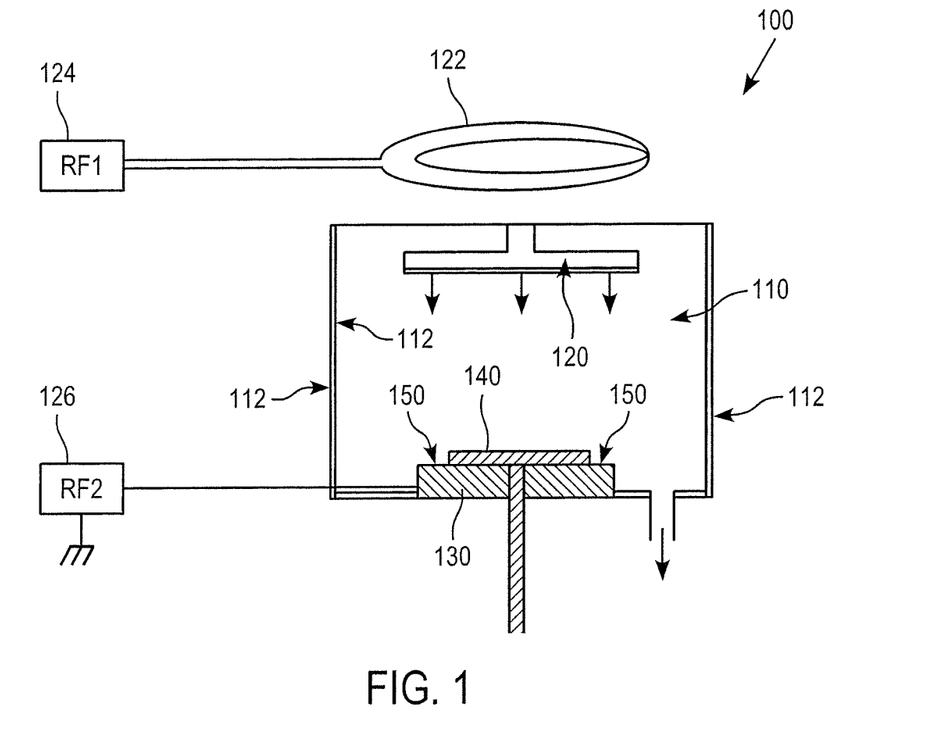
FIG. 1 is a cross-sectional view of a processing chamber suitable for plasma etching semiconductor substrates.

FIG. 1 shows a cross-sectional view of an exemplary plasma reactor 100 for etching substrates. As shown in FIG. 1, the plasma reactor 100 includes a plasma processing chamber 110, an antenna disposed above the chamber 110 to generate plasma, which is implemented by a planar coil or RF coil 122. The planar or RF coil 122 is typically energized by an RF generator 124 via a matching network (not shown). Such chambers 110 are called inductively coupled plasma (ICP) chambers. To supply process gas to the interior of the chamber 110, there is provided a gas distribution plate or showerhead 120, which preferably includes a plurality of holes for releasing gaseous source materials, for example, the etchant source gases, into the RF-induced plasma region between the showerhead 120 and a semiconductor substrate or wafer 140 supported on a substrate support 150 comprising lower electrode assembly 130. While an inductively coupled plasma reactor is shown in FIG. 1, the plasma reactor 100 can incorporate other plasma generating sources such as capacitive coupled plasma (CCP), microwave, magnetron, helicon, or other suitable plasma generating equipment, in which case the antenna is omitted.

The gaseous source materials can be introduced into the chamber 110 by other arrangements such as one or more gas injectors extending through the top wall and/or gas ejection ports built into the walls 112 of the chamber 110. In use, a wafer 140 is introduced into chamber 110 defined by chamber walls 112 and disposed on the lower electrode assembly 130. The wafer 140 is preferably biased by a radio frequency generator 126 (also typically via a matching network). The wafer 140 can comprise a plurality of integrated circuits (ICs) fabricated thereon. When the RF power is applied, reactive species (formed from the source gas) etch exposed surfaces of the wafer 140. The by-products, which can be volatile, are then exhausted through an exit port. After processing is complete, the wafer 140 can be subjected to further processing and eventually diced to separate the ICs into individual chips.

The reactor 100 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 140. An exemplary parallel-plate plasma reactor that can be used is a dual-frequency plasma etch reactor, for example, commonly-owned U.S. Pat. No. 6,090,304, which is hereby incorporated by reference in its entirety. In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
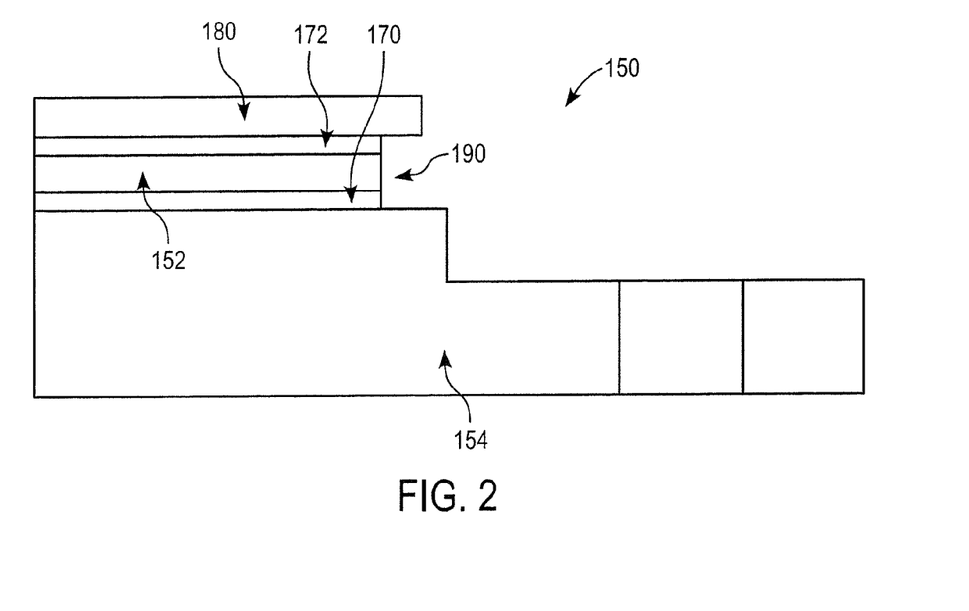
FIG. 2 is a cross-sectional view of a portion of substrate support having various layers bonded together with exposed bond layers located in a mounting groove adapted to receive an edge seal comprising an elastomeric band.
Figure 5:
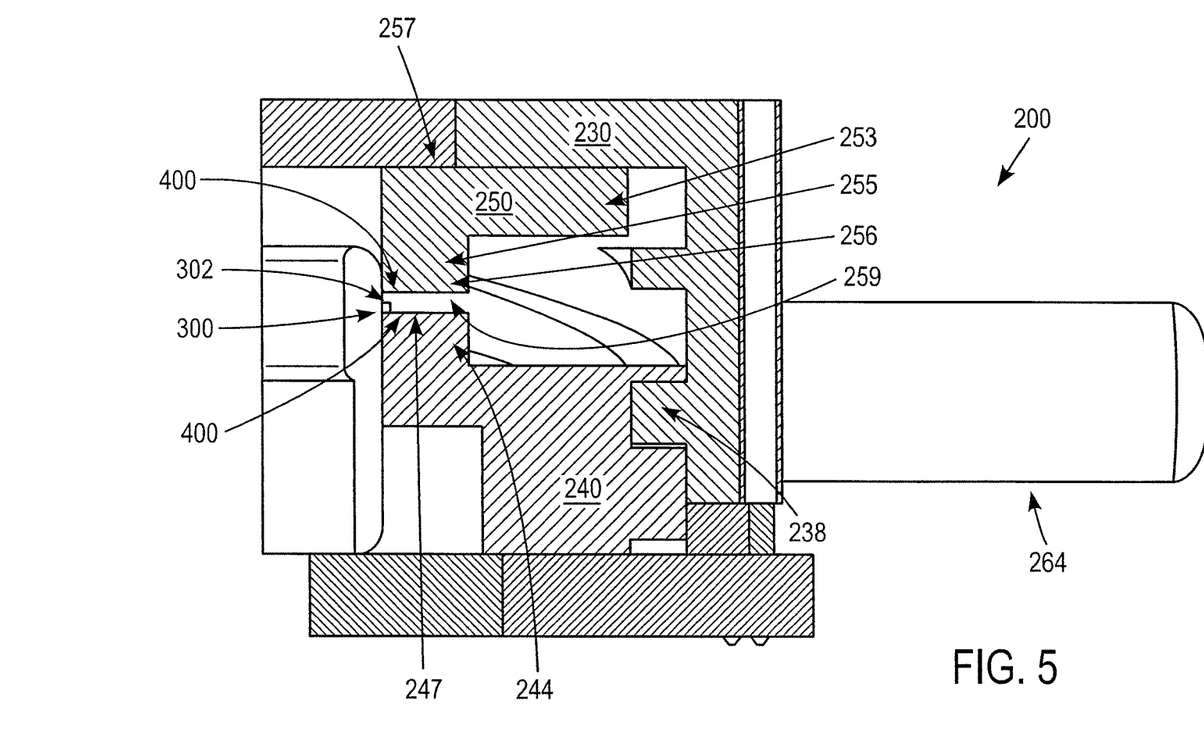
FIG. 5 is a cross-sectional view of a portion of an installation fixture having an elastomer band positioned between the clamp ring and the base ring in accordance with an exemplary embodiment.

FIG. 2 shows a cross-sectional view of a portion of substrate support 150 having various layers bonded together with exposed bond layers located in a mounting groove 190 adapted to receive an edge seal comprising an elastomeric band 300 (FIG. 5). The substrate support 150 comprises a heater plate 152 comprised of a metal or ceramic. An adhesive bonding layer 170 is disposed below the heater plate 152 and bonds the heater plate 152 to a cooling plate 154. Another adhesive bonding layer 172 is disposed above the heater plate 152 and bonds the heater plate 152 to a ceramic plate 180 incorporating one or more electrostatic clamping electrodes. The ceramic plate 180 and the cooling plate 154 may have portions that extend beyond the outermost portions of heater plate 152 and bonding layers 170, 172 to form a mounting groove 190. The outermost portions of the heater plate 140 and the bond layers 170, 172 are substantially aligned with respect to one another. Preferably, the ceramic plate 180 has a larger diameter than the heater plate 152 and the bonding layers 170, 172.

The ceramic layer 180 is preferably an electrostatic clamping layer of ceramic material with an embedded electrode comprised of a metallic material, such as W, Mo etc. In addition, the ceramic layer 180 preferably has a uniform thickness from the center to the outer edge or diameter thereof and is preferably a thin circular plate suitable for supporting 200 mm, 300 mm or 450 mm diameter wafers. Details of a lower electrode assembly having an upper electrostatic clamping layer, the heater layer and the bonding layers 170, 172 are disclosed in commonly owned U.S. Pat. No. 8,038,796, wherein the upper electrostatic clamping layer has a thickness of about 0.04 inch, the upper bonding layer has a thickness of about 0.004 inch, the heater plate 152 comprises a metal or ceramic plate of about 0.04 inch thickness and a heater film of about 0.01 inch thickness, and the lower bonding layer 170 has a thickness of about 0.013 to 0.04 inch. However, different thicknesses of the clamping layer, bond layers 170, 172 and heater layer 152 can be selected to achieve desired process results.

The adhesive bonding layers 170, 172 are preferably formed from a low modulus material such as an elastomeric silicone or silicone rubber material. However, any suitable bonding material can be used. The thickness of adhesive layers 170, 172 can vary depending on the desired heat transfer coefficient. Thus, the thickness of the adhesive layers 170, 172 can be uniform or non-uniform to provide a desired heat transfer coefficient based on manufacturing tolerances of adhesive bonding layers 170, 172. Typically, the thickness of adhesive bonding layers 170, 172 will vary over its applied area by plus or minus a specified variable. Preferably, if the bond layer thickness does not vary by more than 1.5 percent, the heat transfer coefficient between components of the substrate support 150 can be made substantially uniform. For example, for a substrate support 150 comprising an electrode assembly used in the semiconductor industry, the adhesive bonding layers 170, 172 preferably have a chemical structure that can withstand a wide range of temperatures. Thus, the low modulus material can comprise any suitable material or combination of materials, such as a polymeric material compatible with a vacuum environment and resistant to thermal degradation at high temperatures, for example, up to 500° C. In one embodiment, the adhesive bonding layers 170, 172 may comprise silicone and be between about 0.001 to about 0.050 of an inch thick and more preferably about 0.003 to about 0.030 of an inch thick.

As shown in FIG. 2, a portion of the cooling plate 154 and ceramic plate 180 can extend beyond an outermost portion of the heater plate 152, adhesive bond layers 170, 172, thereby forming a mounting groove 190 in the substrate support 150. The material(s) of adhesive bonding layers 170, 172 are typically not resistant to the reactive etching chemistry of semi-conductor plasma processing reactors and must, therefore, be protected to accomplish a useful operation lifetime. To protect the adhesive bonding layers 170, 172, an edge seal in the form of an elastomeric band 300 is placed into the mounting groove 190 to form a tight seal that prevents penetration of the corrosive gases of semi-conductor plasma processing reactors. See, for example, commonly owned U.S. Pat. Nos. 7,884,925 and 8,545,027.

Figure 3:
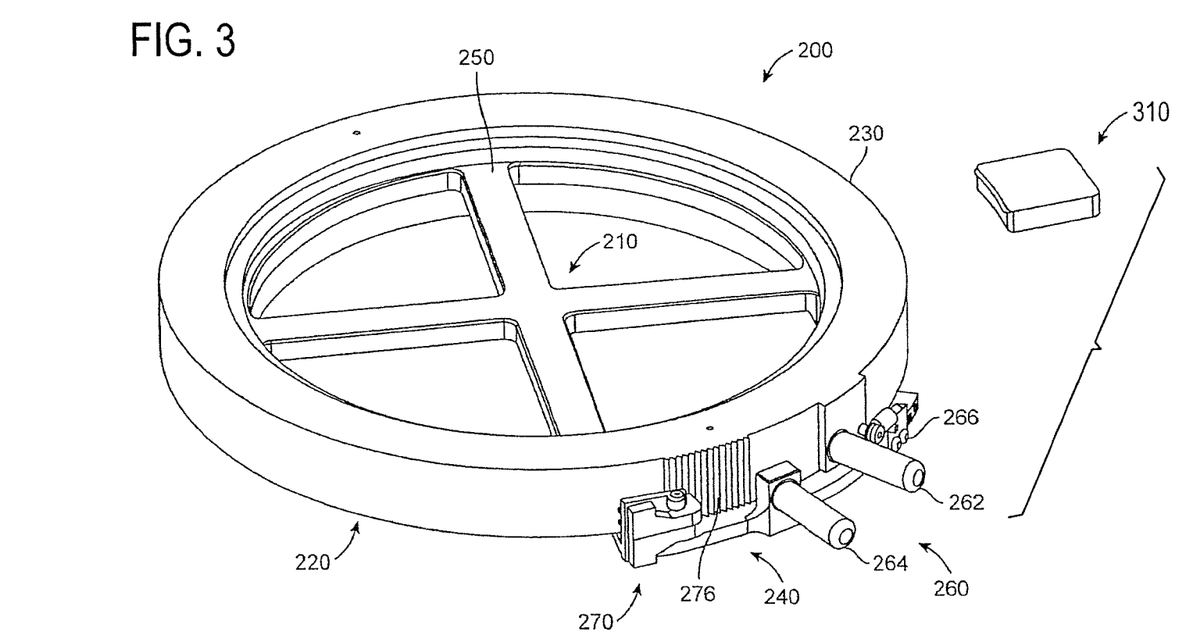
FIG. 3 is a perspective view of an installation fixture, which includes a band loader and installation unit having a top ring, a clamp ring and a base ring in accordance with an exemplary embodiment.

FIG. 3 is a perspective view of an installation fixture 200 as disclosed in commonly owned U.S. application Ser. No. 13/439,491, filed on Apr. 4, 2012, entitled "Installation Fixture for Elastomer Bands and Methods of Using the Same", which is incorporated herein in its entirety. As shown in FIG. 3, the installation fixture 200 includes an elastomer band loader 210 and an installation unit 220. The installation unit 220 includes a top ring 230, a base ring 240, and a clamp ring 250, which is positioned between the top and the base rings 230, 240. The installation unit 220 also includes a latch and release mechanism 260, which releases the elastomer band 300 into the mounting groove 190 upon demand. In accordance with an embodiment, the latch and release mechanism 260 includes a first handle or lever 262 attached to an outer edge of the top ring 230, a second handle or lever 264 attached to an outer edge of the base ring 240, an extension spring 266 attached to the top ring 230, and a dual latch mechanism 270. The dual latch mechanism 270 includes a spring-loaded latch 272, which has a lever or prong 274, which engages a series of teeth or indents 276 on an outer portion of the top ring 230. In addition, if the elastomer band 300 is not fully seated within the mounting groove 190, the installer can use the embedding tool (or push-in-tool) 3100 to seat the elastomer band 300 (FIG. 5) within the groove 190

Figure 4:
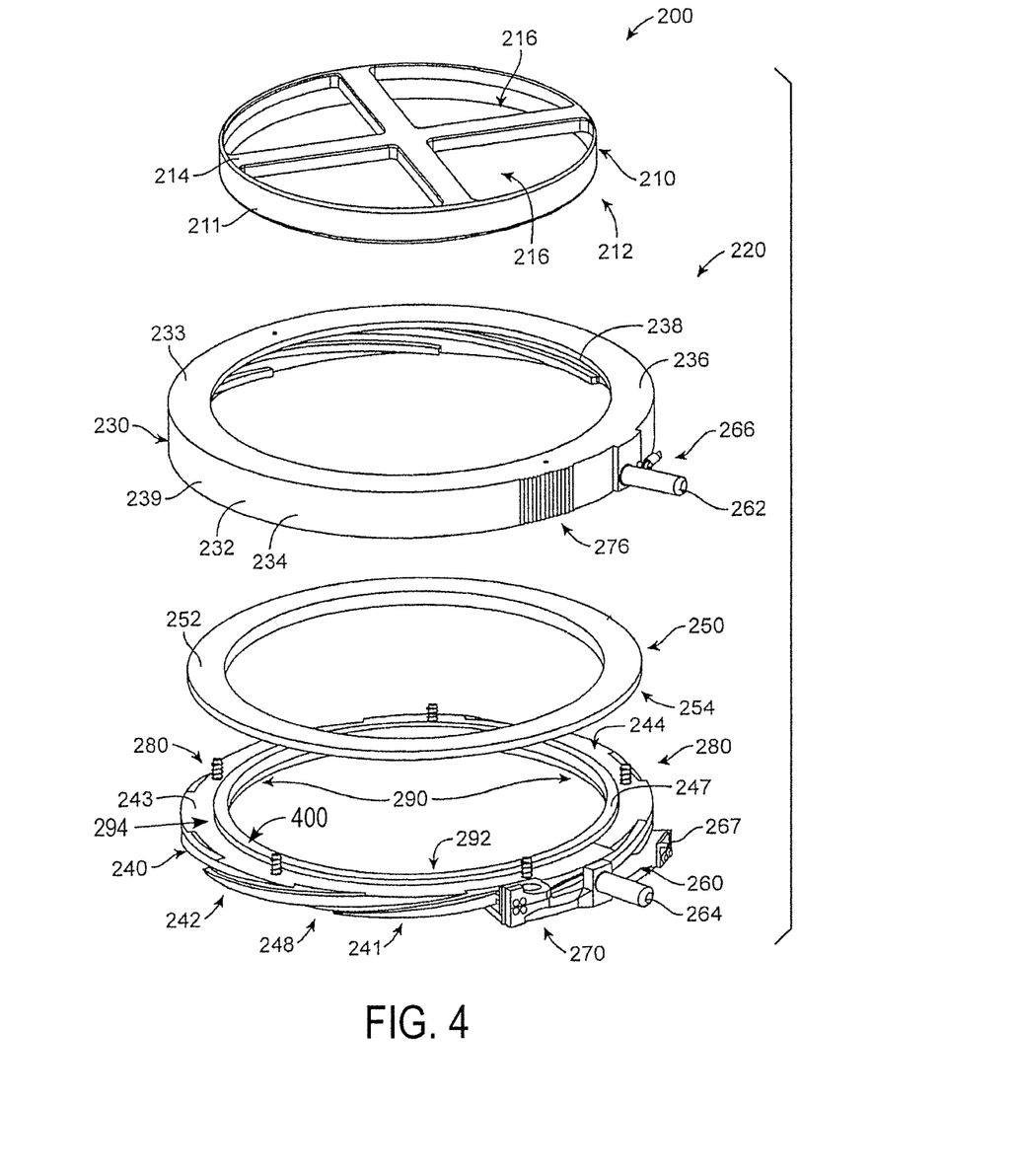
FIG. 4 is another perspective view of the installation fixture of FIG. 3 in an exploded format in accordance with an embodiment.

FIG. 4 is another perspective view of the installation fixture 200 in an exploded format. As shown in FIG. 4, the elastomer band loader 210 comprises an annular member 212 adapted to position the elastomer band within the installation unit 220. The annular member 212 is configured to receive an elastomer band 300 around an outer edge or circumference 211 thereof. In accordance with an embodiment, one or more cross members 214 extends across the annular member 212. The one or more cross members 214 preferably includes at least one opening or gap 216 therein. Alternatively, the elastomer band loader 210 can include a handle or other means for lifting upward on the elastomer band loader 210. The one or more cross members 214 and/or handles (not shown), provide a means to remove the elastomer band loader 210 from within the installation unit 220 after the elastomer band 300 has been loaded within the installation unit 220.

The top ring 230 includes a stepped ring 232 with a flat upper section 236 and a tubular section 234 extending downwardly from an outer periphery of the upper section 236. The upper section 236 extends from an upper edge 233 of the tubular section 234 and extends inward. The tubular section 234 includes one or more inner or internal threads 238, which are configured to receive one or more outer or external threads 248 on the base ring 240. The top ring 230 also includes a series of ridges or teeth 276 on an outer surface 239 on the tubular section 234, which are configured to engage with a dual latch mechanism 270 on the base ring 240. The top ring 230 also includes a handle 262 and an extension spring 266. The handle 262 is configured to engage the latch and release mechanism 260 on the base ring 240. The extension spring 266 mates with a corresponding member 267 of the base ring 240, and the extension spring 266 causes the top ring 230 to rotate, for example, unthread from the base ring 240, when the top ring 230 is not locked into place with the base ring 240 as described below.

The base ring 240 is preferably an annular member 242 having one or more external threads 248 on an outer surface 241, which are configured to engage the one or more internal threads 238 of the top ring 230. The base ring 240 also includes an annular flange 244, which is positioned on an upper surface 243 of the annular member 242 on an inner edge 245 thereof. One or more compression springs 280 extend upward from the upper surface 241 of the annular member 242. The one or more compression springs 280 are preferably three (3) to seven (7) in number, and more preferably five (5) in number, and wherein the one or more compression springs 280 are equally positioned around the annular member 242. The base ring 240 preferably has an inner diameter 290 with respect to an innermost surface 292 of between about 11.0 to 12.0 inches with respect a substrate support designed for processing substrates or wafers with a 300 mm diameter. With respect to processing substrates or wafers with a diameter less than 300 mm, such as 200 mm, or greater than 300 mm, such as 450 mm, the diameters of installation fixture 200 are scaled accordingly.

The clamp ring 250 is an annular member 252, which clamps the elastomer band 300 between a lower surface 259 of the clamp ring 250 and an upper surface 247 of the annular flange 244 of the base ring 240. The clamp ring 250 is preferably comprised of an annular member 252 having an upper portion 253 and a lower portion 255, wherein an inner circumference or diameter of the upper and the lower portions 253, 255 coincide with one another. In accordance with an embodiment, the lower portion 255 has an outer diameter, which is less than an outer diameter of the upper portion 253, and which forms a step 256 formed by a lower surface of the upper portion 253 to an outer surface of the lower portion 255 (FIG. 5). In accordance with an embodiment, the upper and the lower portions 253, 255, each have a relatively flat or planar upper or lower surface 257, 259.

In accordance with an embodiment, the elastomer band loader 210 and the top ring 230, the base ring 240, and the clamp ring 250 of the installation unit 220 is preferably made from a low-friction plastic material such as polyethylene terephthalate (PET) or a fluorocarbon, e.g., TEFLON®. Alternatively, the installation fixture 200 may be made from other materials, such as quartz, ceramic, metal or silicon.

When an elastomer band 300 sticks to the installation fixture 200 during the installation process, several problems can be encountered including but not limited to an increase in installation time for the elastomer band 300 as a result of delay during the release of the elastomer band 300 from the installation fixture 200. In addition, if the elastomer band 300 does not release from the installation fixture 200, an operator may be required to tap or use a pick to release the elastomer band 300 from the fixture 200. The sticking of the elastomer band 300 to the clamp ring 250 and/or base ring 240 can also lead to non-uniformities in the stretch of the elastomer band 300 and/or misalignment of the elastomer band 300 on the ECS. Accordingly, it would be desirable to have a clamping surface 400 adapted to release the elastomer band 300 on at least one of a lower surface 259 of the clamp ring 250 and/or upper surface 247 of the base ring 240. In accordance with an exemplary embodiment, the clamping surface 400 can include a non-stick coating. For example, the base ring 240 and/or clamp ring 250 can be made of a ceramic or metal material, and the non-stick coating can be applied to the upper surface 247 of the base ring 240 and/or the lower surface 259 of the clamp ring 250. In accordance with an exemplary embodiment, the clamping surface 400 include a plurality of grooves (or microgrooves) 410 (FIG. 8), which can help prevent the elastomer band 300 from sticking to the upper and/or lower surfaces 247, 259 of the base ring 240 and clamp ring 250, after the elastomer band 300 is compressed and released from the installation fixture 200. In accordance with an exemplary embodiment, the plurality of grooves 410 are substantially parallel to one another.

FIG. 5 is a cross-sectional view of a portion of an installation fixture having an elastomer band 300 positioned between the base ring 240 and the clamp ring 250. As shown in FIG. 5, once the elastomer band 300 has been properly seated on the upper surface 247 of the annular flange 244 of the base ring 240, the clamp ring 250 is lowered onto the base ring 240. As the clamp ring 250 is lowered onto an upper surface 302 of the elastomer band 300, the springs 282 on each of the one or more compression rings 280 compress downward. The springs 282 of the one or more compression rings 280 lift or push the clamp ring 250 upward upon release. The top ring 230 is then lowered onto the base ring 240. As the top ring 230 is lowered onto the base ring 240, the one or more internal threads 238 of the top ring 230 engage the one or more external threads 248 of the base ring 240, which clamps or fixes the clamp ring 250 onto an upper surface 302 of the elastomer band 300. The elastomer band 300 is then compressed between a lower surface 259 of the clamp ring 250 and an upper surface 247 of the annular flange 244 of the base ring 240. In accordance with an exemplary embodiment, an upper surface 247 the annular flange 244 and the lower surface 259 of the clamp ring 250 each have a micro-grooved surface 410 as disclosed herein.

The elastomer band 300 can be constructed from any suitable semiconductor processing compatible material. For example, the elastomer band 300 is preferably constructed of curable fluoroelastomeric fluoropolymers (FKM) capable of being cured to form a fluoroelastomer, a curable perfluoroelastomeric perfluoropolymers (FFKM), and/or a material having high chemical resistance, low and high temperature capability, resistance to plasma erosion in a plasma reactor, low friction, and electrical and thermal insulation properties. The shape of the elastomer band 300 is also not particularly limited and the elastomer bands may be circular, square or rectangular in cross-section. The elastomer bands 300 may also have an irregularly shaped cross-section, such as rectangular cross-section with a concave outer surface as disclosed in commonly owned U.S. Patent Publication No. 2013/0097840.

Figure 6:
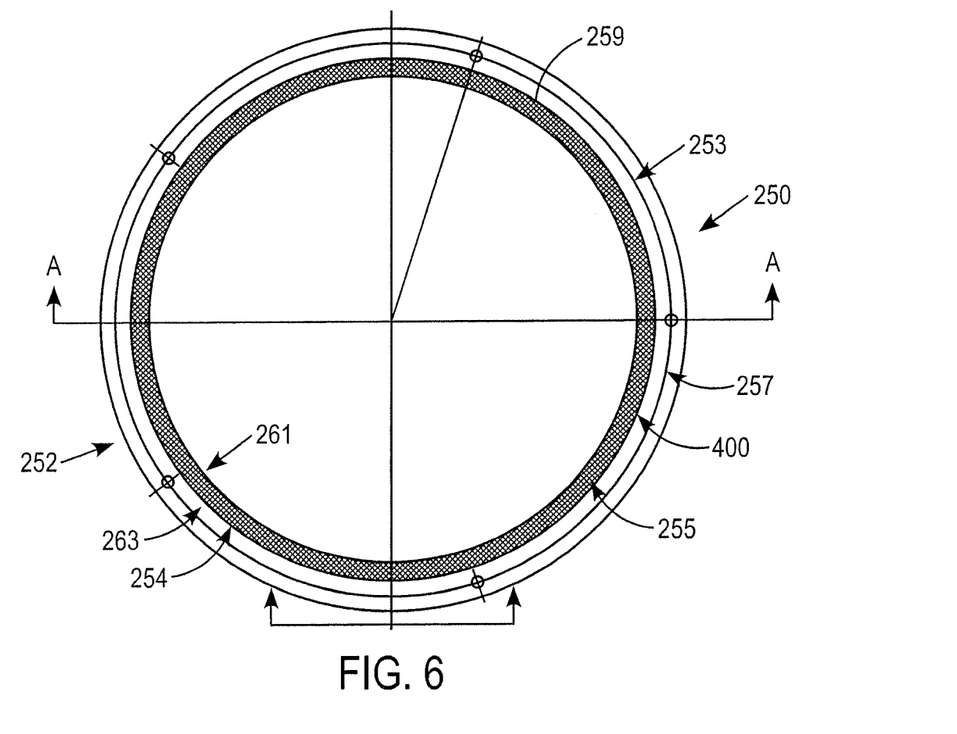
FIG. 6 is a bottom view of a clamp ring of the installation fixture in accordance with an exemplary embodiment.
Figure 7:
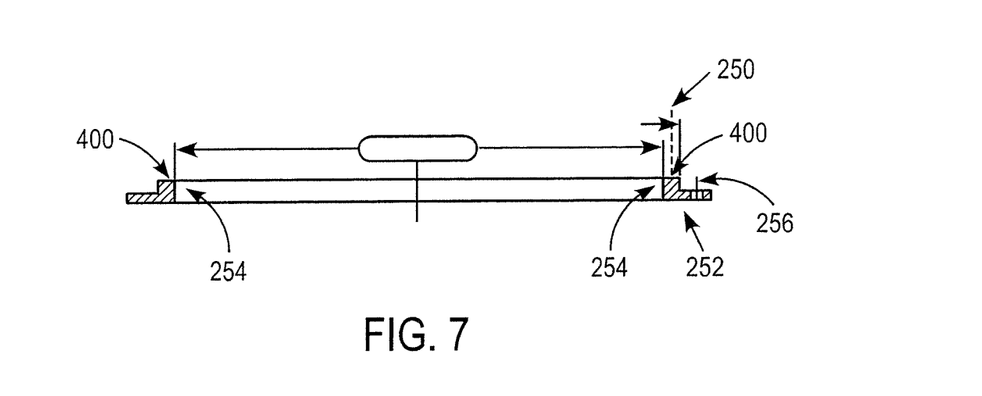
FIG. 7 is a cross-sectional view of the clamp ring of FIG. 6 in accordance with an exemplary embodiment.

As shown in FIGS. 6 and 7, the clamp ring 250 preferably comprised of an annular member 252 having an upper portion 253 and a lower portion 255, wherein an inner circumference or diameter of the upper and the lower portions 253, 255 coincide with one another. In accordance with an embodiment, the lower portion 255 has an outer diameter, which is less than an outer diameter of the upper portion 253, and which forms a step 256 formed by a lower surface of the upper portion 253 to an outer surface of the lower portion 255. In accordance with an embodiment, the upper and the lower portions 253, 255, each have a relatively flat or planar upper or lower surface 257, 259. In accordance with an exemplary embodiment, the lower surface 259 of the clamp ring 250 includes a micro-grooved surface 410.

Figure 8:
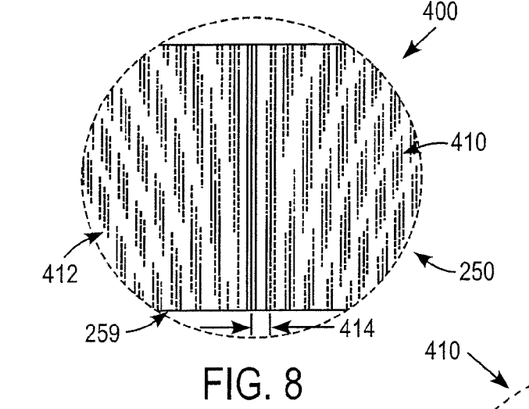
FIG. 8 is a top view of a portion of a micro-grooved surface in accordance with an exemplary embodiment.
Figure 10:
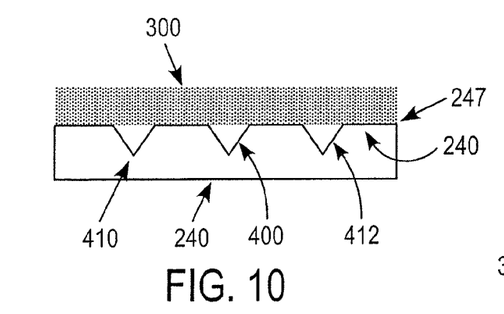
FIG. 10 is a cross-sectional view of a micro-grooved surface and an elastomeric band in a non-compressed state in accordance with an exemplary embodiment.
Figure 11:
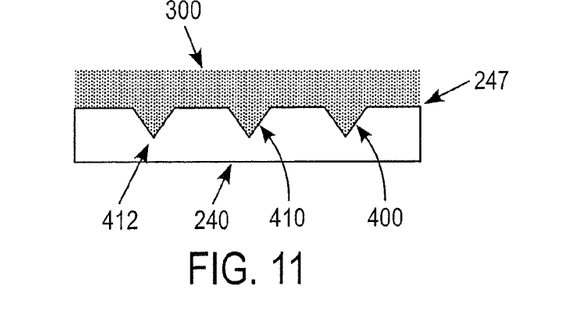
FIG. 11 is a cross-sectional view of the micro-grooved surface and an elastomeric band in a compressed state in accordance with an exemplary embodiment.

FIG. 8 is a top view of a clamping surface 400 have a micro-grooved surface 410 on the lower surface 259 of the clamp ring 250 in accordance with an exemplary embodiment. As shown in FIG. 8, the micro-grooved surface 410 includes a plurality of grooves (or channels) 412, which extend radially across and circumferentially around the lower surface 259 of the clamp ring 250. For example, each of the plurality of grooves 412 preferably extends radially from an inner edge 261 of the lower surface 259 to an outer edge 263 of the lower surface 259 of the clamp ring 250 in a generally radially direction. In accordance with an exemplary embodiment, each of the plurality of grooves 412 from center to center point 414 is about 0.02462 inches (±0.005 inches). For example, for a clamp ring 250 having an inner diameter of about 11.7 inches and an outer diameter of about 13.0 inches, the lower surface 259 of the clamp ring 250 can have about 1462 grooves. In accordance with an exemplary embodiment, the upper surface 247 of the base ring 240 can also include a micro-grooved surface 410 as shown in FIGS. 10 and 11 extending circumferentially around the upper surface 247 of the base ring 240. In accordance with an exemplary embodiment, the micro-grooved surface 410 on the base ring 240 and the clamp ring 250 can be identical. In accordance with an exemplary embodiment, the plurality of grooves 412 can be machined into the upper surface 247 of the base ring 240 and/or the lower surface 259 of the clamp ring 250 by conventional machining techniques.

In accordance with an exemplary embodiment, the plurality of grooves 412 can be configured in any suitable configuration or pattern on clamping surface 400 of the upper surface 247 of the base ring 240 and the lower surface 257 of the clamp ring 250. For example, the plurality of grooves 412 can be concentrically positioned on the upper and lower surfaces 247, 259 of the base ring 240 and clamp ring 250 in a continuous pattern and/or a spiral pattern. Alternatively, in accordance with an exemplary embodiment, the plurality of grooves 412 can be discontinuous (or non-continuous). For example, the plurality of grooves 412 can extend only partially across the lower surface 259 of the clamp ring 250 or the upper surface 247 of the base ring 240, and/or on only a portion of the upper and lower surfaces 247, 259.

Figure 9:
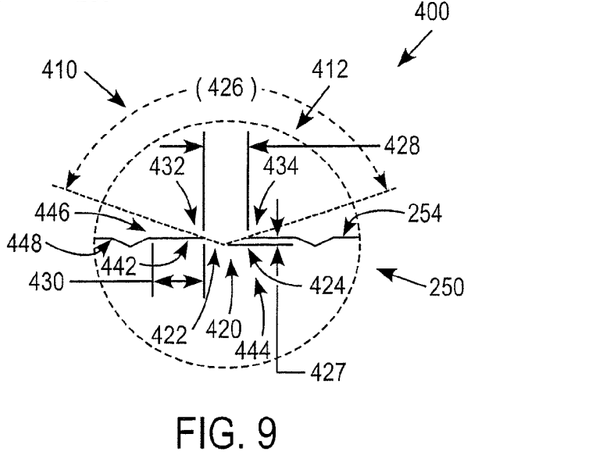
FIG. 9 is a cross-sectional view of the micro-grooved surface as shown in FIG. 8 in accordance with an exemplary embodiment.

FIG. 9 is a cross-sectional view of the micro-grooved surface 410 on the lower surface 259 of the clamp ring 250 in accordance with an exemplary embodiment. As shown in FIG. 9, each of the plurality of grooves 412 has an angled groove 420 formed by a first angular surface 422 and a second angular surface 424 having a common endpoint or vertex, and preferably having an equal angulation relative to the lower surface 259 of the clamp ring 250. In accordance with an exemplary embodiment, the first and second angular surfaces 422, 424 form an angle 426 of about 10 degrees to about 170 degrees, and more preferably about 90 to 160 degrees, and most preferably about 140 degrees between the first angular surface 422 and the second angular surface 424. In accordance with an exemplary embodiment, the angle 426 between the first and second angular surfaces 422, 424 is greater than 90 degrees.

In accordance with an exemplary embodiment, each of the plurality of grooves 412 has a depth 427 of about 0.0009 to 0.0039 inches, and more preferably a depth 427 of about 0.0024 inches. The width or distance 428 from one edge 432 of the groove 420 to another edge 434 of the groove is about 0.010 to 0.016 inches, and more preferably about 0.013 inches. In accordance with an exemplary embodiment, each of the plurality of grooves 412 is spaced apart 430 from one another by about 0.012 to 0.016 inches and more preferably about 0.014 inches. The spacing 430 of each of the plurality of grooves 412 extends from an edge 442 of a first groove 444 to an adjacent edge 446 of a second groove 448 along the relatively planar lower surface 254 of the clamp ring 250 and/or the upper surface 247 of the base ring 240.

FIGS. 10 and 11 are cross-sectional view of the base ring 240 having a micro-grooved surface 410 and an elastomeric band 300 in a non-compressed state and compressed state, respectively in accordance with an exemplary embodiment. In accordance with an exemplary embodiment, the micro-grooved surface 410 preferably extends radially across the base ring 240 from the inner diameter 290 (or edge) to an outer edge 294 (FIG. 4) of the annular flange 244. In accordance with an exemplary embodiment, when the elastomer band 300 is compressed between the micro-grooved surfaces 410 on the lower surface 259 of the clamp ring 250 and the upper surface 247 of the base ring 240, the elastomer band 300 deforms to fill into the plurality of grooves 412, thereby stretching the surface of the elastomer band 300 slightly to accommodate the increased length of the elastomer band required to partial or fully fill the plurality of grooves 412. For example, in accordance with an exemplary embodiment, the upper surface 247 of the base ring 240 and the lower surface 259 of the clamp ring 250 can include areas which are not in contact with the elastomer band when the band is clamped.

In accordance with an exemplary embodiment, wherein the clamping surface on the upper surface 247 of the base ring 240 and/or the lower surface 259 of the clamp ring 250 has a greater surface area in contact with the elastomer band 300 when the elastomer band 300 is clamped than when the elastomer band 300 is declamped. When the compression is removed, for example, the elastomer band 300 is released from the installation fixture 200, the elastomer band 300 contracts to its original shape and length, and the slight contraction of the elastomer band surface 300 from the plurality of grooves 412 helps release the elastomer band 300 from the clamping surfaces 247, 259.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An annular installation fixture adapted to mount an elastomer band in a mounting groove around a semiconductor substrate support used for supporting a semiconductor substrate in a plasma processing chamber, comprising:
   an installation unit comprising:
      a top ring, the top ring having one or more internal threads;
      a clamp ring;
      a base ring, the base ring having one or more external threads, which are configured to receive the one or more internal threads of the top ring, and upon tightening of the top ring onto the base ring, the elastomer band is clamped between a lower surface of the clamp ring and an upper surface of the base ring, and a clamping surface adapted to release the elastomer band on at least one of the lower surface of the clamp ring and/or the upper surface of the base ring; and
      a latch and release mechanism, which releases the elastomer band into the mounting groove by declamping the elastomer band from between the clamp ring and the base ring; and a band loader, which positions the elastomer band within the installation unit between the clamp ring and the base ring.

2. The annular installation fixture of claim 1, wherein the clamp ring is an annular ring having an upper section and a lower section, which forms a step on a lower portion of the clamp ring.

3. The annular installation fixture of claim 1, wherein the latch and release mechanism includes a first handle attached to an outer edge of the top ring, a second handle attached to an outer edge of the base ring, and a latch mechanism, which secures the top ring to the base ring.

4. The annular installation fixture of claim 1, wherein the clamping surface on the at least one of the upper surface of the base ring and/or the lower surface of the clamp ring is a non-stick coating.

5. The annular installation fixture of claim 1, wherein the clamping surface on the at least one of the upper surface of the base ring and/or the lower surface of the clamp ring is a plurality of grooves.

6. The annular installation fixture of claim 5, wherein the lower surface of the clamp ring and the upper surface of the base ring each have a plurality of grooves.

7. The annular installation fixture of claim 5, wherein the plurality of grooves extend radially from an inner edge to an outer edge of the lower surface of the clamp ring and/or an inner edge to an outer edge of the upper surface of the base ring.

8. The annular installation fixture of claim 5, wherein the plurality of grooves are not continuous.

9. The annular installation fixture of claim 5, wherein the plurality of grooves extend circumferentially around the upper surface of the base ring and/or the lower surface of the clamp ring.

10. The annular installation fixture of claim 5, wherein each of the plurality of grooves has an angled groove formed by a first angular surface and a second angular surface, and wherein each of the angled grooves forms an angle of about 10 degrees to about 170 degrees between the first angular surface and the second angular surface.

11. The annular installation fixture of claim 10, wherein the angled groove is greater than 90 degrees.

12. The annular installation fixture of claim 5, wherein the plurality of grooves has a depth of about 0.0009 to 0.0039 inches, a width from one edge of the groove to another edge of the groove of about 0.010 to 0.016 inches, and each of the plurality of grooves is spaced apart from one another by about 0.012 to 0.016 inches.

13. The annular installation fixture of claim 6, wherein the upper and lower clamping surfaces on the lower surface of the clamp ring and the upper surface of the base ring includes areas not in contact with the elastomer band when the elastomer band is clamped.

14. The annular installation fixture of claim 5, wherein the clamping surface on the lower surface of the clamp ring and/or the upper surface of the base ring has a greater surface area in contact with the elastomer band when the elastomer band is clamped than when the elastomer band is declamped.

15. The annular installation fixture of claim 5, wherein the plurality of grooves are substantially parallel or concentric.

16. The annular installation fixture of claim 1, wherein the clamp ring and the base ring are made of plastic.

\* \* \* \* \*